United States Patent
Li et al.

(10) Patent No.: US 11,665,873 B2
(45) Date of Patent: May 30, 2023

(54) CONDUCTIVE PLASTIC AND APPLICATION THEREOF

(71) Applicant: DONGGUAN LUXSHARE PRECISION INDUSTRY CO. LTD., Dongguan (CN)

(72) Inventors: Huabing Li, Dongguan (CN); Xiaobo Fu, Dongguan (CN)

(73) Assignee: DONGGUAN LUXSHARE PRECISION INDUSTRY CO. LTD., Dongguan (CN)

( * ) Notice: Subject to any disclaimer, the term of this patent is extended or adjusted under 35 U.S.C. 154(b) by 421 days.

(21) Appl. No.: 17/024,251

(22) Filed: Sep. 17, 2020

(65) Prior Publication Data

US 2021/0321547 A1    Oct. 14, 2021

(30) Foreign Application Priority Data

Apr. 9, 2020   (CN) .......................... 202010277858.8

(51) Int. Cl.
    *H05K 9/00*     (2006.01)
    *C08L 53/02*    (2006.01)
    *H01B 11/00*    (2006.01)

(52) U.S. Cl.
    CPC .......... *H05K 9/0081* (2013.01); *C08L 53/025* (2013.01); *C08L 2203/202* (2013.01); *C08L 2205/03* (2013.01); *H01B 11/00* (2013.01)

(58) Field of Classification Search
    CPC ...... C08L 53/025; C08L 51/085; C08L 33/26; C08L 2205/04; C08L 2203/202; C08L 2205/03; H05K 9/0081; C08K 3/04; H01B 11/00
    See application file for complete search history.

(56) References Cited

U.S. PATENT DOCUMENTS

| 4,378,299 A * | 3/1983 | Alexander ........... C10M 149/06 |
| | | 508/555 |
| 6,294,257 B1 | 9/2001 | Tsukakoshi et al. |
| 2011/0143126 A1* | 6/2011 | Meyer ..................... C08L 69/00 |
| | | 524/508 |
| 2017/0044356 A1 | 2/2017 | Yang |

(Continued)

FOREIGN PATENT DOCUMENTS

| CN | 101891914 A | 11/2010 |
| CN | 102382563 A | 3/2012 |
| CN | 102804288 A | 11/2012 |

(Continued)

OTHER PUBLICATIONS

Taiwanese Search Report for Taiwanese Application No. 109144334, dated Aug. 25, 2021.

*Primary Examiner* — Vishal V Vasisth
(74) *Attorney, Agent, or Firm* — Birch, Stewart, Kolasch & Birch, LLP

(57) ABSTRACT

The present invention discloses a conductive plastic, based on the total mass of the conductive plastic, which includes: a resin with a low melting point 42%-54%; a toughened resin 4%-10%; carbon black 33%-47%; a dispersant 1%-3%; wherein, the toughened resin is a polymer of acrylic acid and siloxane; and use thereof. The conductive plastic of the present invention has a low melting temperature and high conductive performance, and is suitable for a wire cable shielding layer.

7 Claims, 1 Drawing Sheet

(56) References Cited

U.S. PATENT DOCUMENTS

2018/0303013 A1  10/2018  Li et al.

FOREIGN PATENT DOCUMENTS

| | | |
|---|---|---|
| CN | 104693637 A | 6/2015 |
| CN | 103319765 B | 12/2015 |
| CN | 105131419 A | 12/2015 |
| CN | 104098813 B | 5/2016 |
| CN | 106336630 A | 1/2017 |
| CN | 104254940 B | 3/2017 |
| CN | 106653210 A | 5/2017 |
| CN | 106883505 A | 6/2017 |
| CN | 108257713 A | 7/2018 |
| CN | 109337231 A | 2/2019 |
| CN | 109563241 A | 4/2019 |
| CN | 109608748 A | 4/2019 |
| CN | 109777027 A | 5/2019 |
| JP | 2000-232539 A | 9/2006 |
| JP | 2008-189701 A | 8/2008 |
| JP | 2012-214625 A | 11/2012 |
| JP | 5983850 B1 | 9/2016 |
| JP | 2018-28031 A | 2/2018 |
| JP | 2018-171916 A | 11/2018 |

\* cited by examiner

CONDUCTIVE PLASTIC AND APPLICATION THEREOF

CROSS-REFERENCE TO RELATED APPLICATION

This application claims priority to Chinese Patent Application No. 202010277858.8, filed on Apr. 9, 2020, which is hereby incorporated by reference in its entireties.

TECHNICAL FIELD

The present invention relates to a conductive plastic and application thereof, and particularly to a conductive plastic for a wire cable shielding layer in the field of electronic communication.

BACKGROUND

Power cables are mainly used for transmission and distribution of electrical energy, and are often used in underground power grids, leading-outs of power stations and substations, underwater transmission lines, internal power supply lines of industrial enterprises. Shielding layer plays a vital role in medium and high voltage cables, providing a smooth interface between the conductor and the insulation layer and reducing the damage to the cable insulation layer caused by stress concentrations due to conductor with a rough surface. The quality of the semi-conductive shielding material largely determines the service life and safety of the cable.

CN109337231A discloses a graphene flame retardant shielding cable material and a preparation method thereof, comprising 70-85 parts by weight of polyvinyl chloride, 10-15 parts by weight of EVA resin, 10-15 parts by weight of conductive carbon black, 1-2 parts by weight of graphene, 3-8 parts by weight of modified magnesium aluminum hydrotalcite, 1-2 parts by weight of zinc borate, 2-3 parts by weight of lubricant, 0.5-1 parts by weight of stabilizer, 1-2 parts by weight of crosslinker, 0.5-0.8 parts by weight of composite antioxidant, said composite antioxidant comprising 85 parts by weight of antioxidant 300, 3 parts by weight of VE, 2 parts by weight of yttrium oxide, 10 parts by weight of white carbon black. The shielding material of the invention solves the problems of the existing graphene semiconductor shielding materials' poor oxidation resistance and flame retardant performance, the cable being prone to aging and so on.

CN103319765B discloses a conductive, barrier polyethylene composition and preparation method and application thereof, comprising: (A) 50 to 90 mass parts of base resin, which includes (A1) 70 to 97 mass % of polyethylene resin and (A2) 3 to 30 mass % of polyamide resin, the polyamide resin (A2) being dispersed in the polyethylene resin (A1) in a multilayer overlapped and crossed lamellar structure; (B) 0.1 to 10 mass parts of a polyolefin graft copolymer; and (C) 5 to 25 mass parts of carbon black. The composition of the invention roots in polyethylene as the main base resin, using the method of melting and kneading, so that the polyamide resin forms a multilayer overlapped and crossed lamellar structure in the polyethylene resin, with excellent barrier and conductive performance, low cost, increasing in the processing window of the material, broadening the application field of the material, but it is mainly used for the preparation of containers for storing fuel and organic solvents and transmission pipelines, etc.

Due to the high temperature resistance and high processing pressure of compounds for traditional cable shielding layer, it is easy to break the cable core wire and cause damage to the cable; in addition, the shielding performance of compounds for traditional cable shielding layer needs to be further improved. Therefore, the compound for cable shielding layer is still the focus of research in this field.

Invention Summary

A main object of the present invention is to provide a conductive plastic and application thereof, so as to solve the problems of the wire cable shielding layer having a high melting point, requiring high processing pressure, and having weak shielding performance in the prior art.

In order to achieve the above objects, the conductive plastic provided by the present invention includes (based on the total mass of the conductive plastic):

| | |
|---|---|
| a resin with a low melting point | 42%-54%; |
| a toughened resin | 4%-10%; |
| carbon black | 33%-47%; |
| a dispersant | 1%-3%; | wherein, the toughened resin is a polymer of acrylic acid and siloxane.

In an embodiment, the toughened resin is an acrylic-siloxane-network interpenetrating polymer; melt flow index of the toughened resin is 0.8-1.5 g/10 min, grafting ratio thereof is 0.8-1.3%, and/or density thereof is 0.80-1.00 g/cm$^3$.

In an embodiment, the dispersant is polyacrylamide.

In an embodiment, the dispersant is a cationic polyacrylamide; molecular weight of the cationic polyacrylamide is 8-12 million and cation concentration thereof is 10-70%.

In an embodiment, the resin with a low melting point is a linear block copolymer, wherein the block comprises ethylene and butylene.

In an embodiment, the resin with a low melting point is a hydrogenated styrene-butadiene block copolymer.

In an embodiment, the conductive plastic includes (based on the total mass of the conductive plastic):

| | |
|---|---|
| a resin with a low melting point | 42%-51%; |
| a toughened resin | 4%-8%; |
| carbon black | 38%-47%; |
| a dispersant | 2%-3%; | wherein, the carbon black comprises 35%-40% of conductive carbon black and 3%-7% of superconductive carbon black.

In an embodiment, the conductive plastic further includes a coupling agent; the coupling agent is an organosilicon compound; the coupling agent is added in an amount of 1%-3% based on the total mass of the conductive plastic.

In an embodiment, the conductive plastic further includes a redox agent; the redox agent is added in an amount of 1%-3% based on the total mass of the conductive plastic.

In order to achieve the above objects, the present invention further provides a wire cable shielding layer, which comprises the above-described conductive plastic.

The present invention has the following advantageous effects:

The present invention provides a conductive plastic, which is refined from superconductive carbon black, a toughened resin and a processing aid. The conductive plastic of the present invention has a low melting temperature and high flowability, and thus can greatly reduce pressure of the processing mold and avoid the problem of breaking of core wire of wire cable; the conductive plastic of the present invention has better shielding performance and conductive performance as compared to traditional conductive plastic.

DESCRIPTION OF DRAWINGS

Prior Art

Present Invention

Figure 2:
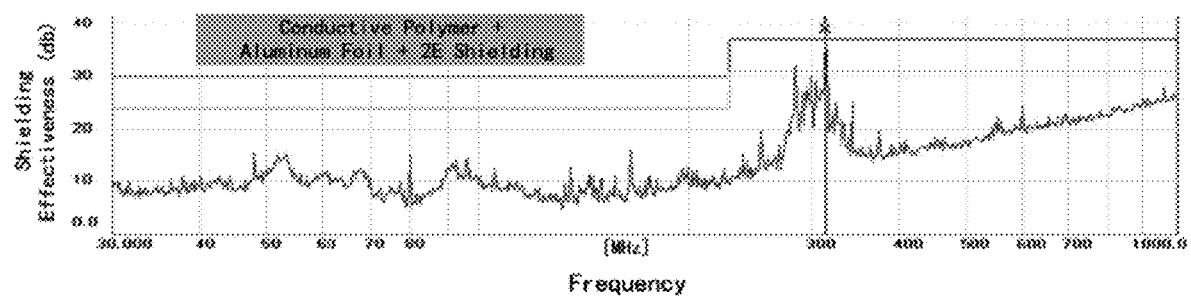

FIG. 2 is an electromagnetic wave shielding effectiveness diagram of the conductive plastics of Examples 1 and 2 of the present invention+aluminum foil+2E shielding.

DETAILED DESCRIPTION

Examples of the present invention will be described in details as follows, and the present examples are carried out on a premise of the technical solutions of the present invention, and provide detailed embodiments and processes, but the scope of the present invention is not limited to the below described examples. The experimental methods, specific conditions of which are not specified in the following examples, usually follow the conventional conditions.

The present invention provides a conductive plastic, which, based on the total mass of the conductive plastic, includes:

| | |
|---|---|
| a resin with a low melting point | 42%-54%; |
| a toughened resin | 4%-10%; |
| carbon black | 33%-47%; |
| a dispersant | 1%-3%; | wherein, the toughened resin is a polymer of acrylic acid and siloxane; optionally, the toughened resin is an acrylic-siloxane-network interpenetrating polymer, which has a unique interpenetrating polymer network that can provide high impact strength and good weatherability. Besides, the polymer is a structural surfactant. Surfactant is a molecule formed from two completely different kinds of particles, one kind of particles has extremely strong lipophilicity while the other kind of particles has extremely strong hydrophilicity. After being dissolved in water, the polymer can reduce surface tension of water, and improve solubility of organic compounds. As a preferred technical solution, melt flow index of the toughened resin is 0.8-1.5 g/10 min (2.16 kg counterweight), grafting ratio thereof is 0.8-1.3%, and/or density thereof is 0.80-1.00 g/cm$^3$.

As a preferred technical solution, the toughened resin is added in an amount of 4%-8% or 6%-10%, more optionally 8%, based on the total mass of the conductive plastic.

In an embodiment, the resin with a low melting point is a linear block copolymer, optionally a linear triblock polymer, wherein the block comprises ethylene and butylene. Optionally, the resin with a low melting point is a hydrogenated styrene-butadiene block copolymer, which is a linear triblock copolymer where polystyrene is the end block and ethylene-butylene copolymer obtained from hydrogenation of polybutadiene is the intermediate elastic block.

The hydrogenated styrene-butadiene block copolymer does not contain a double bond, thereby having good stability and age resistance. In the present invention, the resin with a low melting point is added into the conductive plastic as a thermoplastic elastomer, which can change appearance of the product and softness thereof.

As a preferred technical solution, the resin with a low melting point is added in an amount of 42%-51%, optionally 48%-50%, and more optionally 50%, based on the total mass of the conductive plastic.

Carbon black is a kind of amorphous carbon. It is light, loose and very fine black powder with a very large surface area, ranging from 10 to 3000 m$^2$/g, and is the product of incomplete combustion or thermal decomposition of carbon-containing substances (coal, natural gas, heavy oil, fuel oil, etc.) under conditions of insufficient air. Specific gravity thereof is 1.8-2.1. It is referred to as "gas black" when being prepared from natural gas, as "light black" when being prepared from oil, and as "acetylene black" when being prepared from acetylene. In addition, there are also "channel black" and "furnace black". According to performance of carbon black, there are "reinforcing carbon black", "conductive carbon black", "wear-resistant carbon black", etc. It can be used as a black dye for making Chinese ink, printing ink, paints, etc., and also be used as a reinforcing agent for rubber. Conductive carbon black is carbon black with low resistance or high resistance performance, which can impart electrical conductivity or anti-static function to the article. It features small particle size, large specific surface area and roughness, high structure, clean surface (less compounds), etc., thus can be used for wire cable shielding material.

Superconductive carbon black has better electrical conductivity as compared to general conductive carbon black, and features low amount, and high conductive performance, as a result of which, when being used for wire cable shielding, it can improve dispersibility, anti-ultraviolet performance, and anti-corrosion performance of the product.

As a preferred technical solution, carbon black in the present application comprises conductive carbon black and superconductive carbon black, and based on the total mass of the conductive plastic, conductive carbon black is added in an amount of 30%-40%, optionally 35%-40%, and more optionally 35%, and superconductive carbon black is added in an amount of 3%-7%, optionally 3%-5%, and more optionally 5%. Conductive carbon black and superconductive carbon black of the present invention could be commercially available merchandise, but the present invention does not make particular definitions.

Dispersant is a surfactant that simultaneously has two opposite properties lipophilicity and hydrophilicity in the molecule. It can uniformly disperse those inorganic, organic dye solid and liquid particles that are difficult to be dissolved in a liquid, and meanwhile, can also prevent settlement and aggregation of the particles, forming an amphipathic agent for stabilizing the suspension. The dispersant in the conductive plastic of the present invention is polyacrylamide, optionally cationic polyacrylamide; more optionally, molecular weight of the cationic polyacrylamide is 8-12 million and cation concentration thereof is 10-70%.

As a preferred technical solution, the dispersant is added in an amount of 2%-3%, optionally 2% based on the total mass of the conductive plastic.

In addition, the conductive plastic of the present invention could further include a coupling agent, a redox agent, an antioxidant, a lubricant, etc., and mall amount of other kinds of additives could be further added as needed. The coupling agent is optionally an organosilicon compound; the antioxidant is optionally silver, which has strong antioxidation property, glossiness, and durability, and can reinforce conductive performance; the lubricant can adjust the process production formula. Based on the total mass of the conductive plastic, the coupling agent is optionally added in an amount of 1%-3%, the redox agent is optionally added in an amount of 1%-3%, the antioxidant is optionally added in an amount of 1%-5%, and the lubricant is optionally added in an amount of 0.2%-1%.

The method for preparing the conductive plastic of the present invention is, for example, uniformly mixing a resin with a low melting point, a toughened resin, conductive carbon black, superconductive carbon black, and a dispersant, followed by blending and shaping them to obtain the conductive plastic of the present invention. It is also possible to uniformly grind and mix conductive carbon black and superconductive carbon black, followed by adding the resin with a low melting point, the toughened resin, and the dispersant, then blend and shape. In addition, it is also possible to add other additives such as antioxidant, coupling agent, redox agent, lubricant, etc. As a preferred technical solution, the method for preparing the conductive plastic of the present invention further includes a step of crushing the shaped product and compounding and pressing for shaping it again. Due to the reconstruction kinetics of infinite network chain of carbon black, under the action of high shear rate, the infinite network chain of carbon black is stretched by external force in the shear direction, and when the force is greater than a certain value, the infinite network chain breaks. High viscosity of the polymer prevents this damage from recovering quickly, so electrical conductivity of the conductive plastic is reduced. After crushing and regeneration, the infinite network chain is re-established and the conductivity is restored, so the law that this processing method and processing conditions affects conductivity of carbon black-containing polymers shows great significance on the application of composite conductive polymers.

The conductive plastic of the present invention has a black granular appearance and can be used in the field of electronic communications, especially for wire cable shielding materials. The conductive plastic of the present invention has low melt temperature characteristics, which can enhance the flowability and toughness of the materials, reduce the pressure and temperature of the processing mold, and thus reduce the probability of the core wire being broken during the processing of the cable shielding layer and improve the yield of the product.

The specific examples of the conductive plastic of the present invention are provided as follows, so as to schematically demonstrate the technical solutions of the present invention.

Example 1

The composition of the conductive plastic in the present example is listed as in below Table 1, and is mixed in accordance with the components and ratio in Table 1, followed by being blended, shaped, to obtain the conductive plastic of Example 1, wherein the type of the coupling agent is KH-550, the type of the redox agent is ID 320147, the type of the antioxidant is Irganox 1076, and the type of the lubricant is H-50.

TABLE 1

Composition of the Conductive Plastic of Example 1

| Name of Component | Percentage Content of Component |
|---|---|
| Toughened Resin (Acrylic-Siloxane-Network Interpenetrating polymer) | 4% |
| Coupling Agent (Organosilicon Compound) | 1% |
| Redox Agent | 1% |
| Dispersant (Cationic Polyacrylamide) | 2.8% |
| Ag (Antioxidant) | 5% |
| C+ (Superconductive Carbon Black) | 4% |
| C (Conductive Carbon Black) | 40% |
| SEBS (Resin with a Low Melting Point) | 42% |
| Lubricant | 0.2% |

Example 2

The composition of the conductive plastic in the present example is listed as in below Table 2, and is mixed in accordance with the components and ratio in Table 2, followed by being blended, shaped, to obtain the conductive plastic of Example 2.

TABLE 2

Composition of the Conductive Plastic of Example 2

| Name of Component | Percentage Content of Component |
|---|---|
| Toughened Resin (Acrylic-Siloxane-Network Interpenetrating polymer) | 8% |
| Dispersant (Cationic Polyacrylamide) | 2% |
| C+ (Superconductive Carbon Black) | 5% |
| C (Conductive Carbon Black) | 35% |
| SEBS (Resin with a Low Melting Point) | 50% |

In the present application, processing tests are performed on the conductive plastics of Examples 1 and 2 and the traditional conductive plastic in the art, and the parameters required during the processing of the traditional conductive plastic (pressure, temperature, time, etc.) are shown in below Table 3, while the parameters required during the processing of the conductive plastics of Examples 1 and 2 of the present invention are shown in below Table 4. By comparing Table 3 to Table 4, it could be known that the pressure required by the conductive plastic of the present invention during the processing is greatly reduced, the total pressure is reduced from 100 MPa to 50 MPa; the temperature also receives a great improvement, the temperature of the nozzle is reduced from 230° C. to 100° C., the temperature of the front zone is reduced from 230° C. to 80° C., demonstrating the conductive plastic of the present invention has a low melting point, thereby being capable of greatly reducing the processing temperature and pressure, and well solving the problem of the cable core wire breaking when the conductive plastic is being processed for wire cable shielding layer.

TABLE 3

Processing Parameters for Traditional Conductive Plastic

| Pressure (MPa) | | | | Temperature (° C.) | | | | Time (S) | | |
|---|---|---|---|---|---|---|---|---|---|---|
| Total Pressure | First Pressure | Second Pressure | Holding Pressure | Back Zone | Middle Zone | Front Zone | Nozzle | Ejection | Holding Pressure | Cooling |
| 100 | 50 | 25 | 20 | 210 | 220 | 230 | 230 | 5 | 5 | 6 |

TABLE 4

Processing Parameters for Conductive Plastics of Examples 1 and 2 of the Present Invention

| Pressure (MPa) | | | | Temperature (° C.) | | | | Time (S) | | |
|---|---|---|---|---|---|---|---|---|---|---|
| Total Pressure | First Pressure | Second Pressure | Holding Pressure | Back Zone | Middle Zone | Front Zone | Nozzle | Ejection | Holding Pressure | Cooling |
| 50 | 5 | 0 | 0 | 70 | 80 | 80 | 100 | 5 | 5 | 6 |

The conductive plastic of the present invention can reduce processing pressure and processing temperature of the mold. Besides, since shrinkage rate of the resin has a large range, shrinkage value thereof is large, directivity thereof is obvious, shrinkage rate of LD resin is about 0.1%, and shrinkage rate of the resin is about 0.08%, thus it is easy to deform and warp, and mold's cooling conditions have a great influence on the shrinkage rate. By reducing the melting point of the conductive plastic, and thus reducing the processing temperature of the conductive plastic, the present invention makes it easier to control the mold temperature, maintain uniform and stable cooling, and thus improve the deformation and warping situation of the resin.

Figure 1:
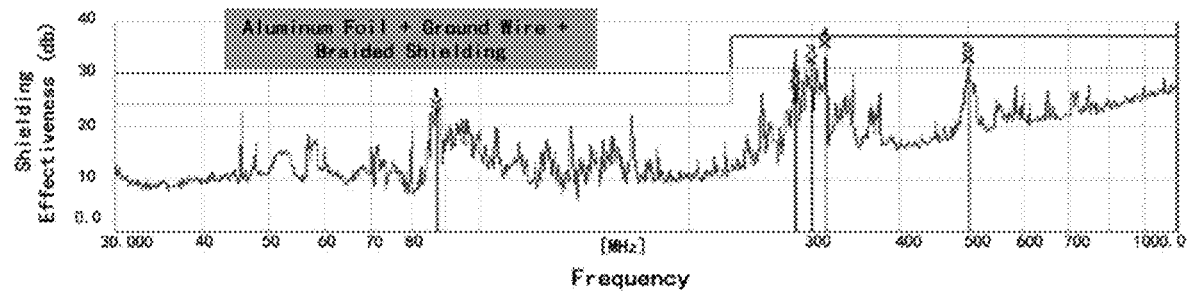
FIG. 1 is an electromagnetic wave shielding effectiveness diagram of aluminum foil+ground wire+braided shielding.

Also, the conductive plastic of the present invention has better conductive and shielding performance, and thus is more suitable for wire cable shielding materials in the field of electronic communications. FIG. 1 is an electromagnetic wave shielding effectiveness diagram of aluminum foil+ground wire+braided shielding in the cable; FIG. 2 is an electromagnetic wave shielding effectiveness diagram of the conductive plastics (i.e. conductive polymers) of Examples 1 and 2 of the present invention+aluminum foil+2E shielding. As can be seen from FIGS. 1 and 2, according to the test result of the national standards (GB9352&9254), the shielding materials including the conductive plastics of Examples 1 and 2 of the present invention have a comparable electromagnetic wave shielding efficiency to that of ground wire shielding in FIG. 1 (≥6 db). As a result, the conductive plastic of the present application has a low melting point and high conductive performance, has high electromagnetic wave shielding efficiency, and is suitable for wire cable shielding layer.

Of course, the present invention can still have various other examples, and without departing the spirit and essence of the invention, the person skilled in the art can make various corresponding alterations and variations, but these corresponding alterations and variations should belong to the scope of the claims of the present invention.

The invention claimed is:

1. A conductive plastic, based on the total mass of the conductive plastic, the conductive plastic includes:

| | |
|---|---|
| a hydrogenated styrene-butadiene block copolymer | 42%-54%; |
| an acrylic-siloxane-network interpenetrating polymer | 4%-10%; |
| carbon black | 33%-47%; |
| polyacrylamide | 1%-3%; | wherein, melt flow index of the acrylic-siloxane-network interpenetrating polymer is 0.8-1.5 g/10 min, and grafting ratio thereof is 0.8-1.3%.

2. The conductive plastic according to claim 1, wherein, density of the acrylic-siloxane-network interpenetrating polymer is 0.80-1.00 g/cm$^3$.

3. The conductive plastic according to claim 1, wherein, the dispersant is a cationic polyacrylamide; molecular weight of the cationic polyacrylamide is 8-12 million and cation concentration thereof is 10-70%.

4. The conductive plastic according to claim 1, wherein, based on the total mass of the conductive plastic, the conductive plastic includes:

| | |
|---|---|
| a hydrogenated styrene-butadiene block copolymer | 42%-51%; |
| an acrylic-siloxane-network interpenetrating polymer | 4%-8%; |
| carbon black | 38%-47%; |
| a dispersant | 2%-3%. |

5. The conductive plastic according to claim 1, wherein, the conductive plastic further includes a coupling agent; the coupling agent is an organosilicon compound; the coupling agent is added in an amount of 1%-3% based on the total mass of the conductive plastic.

6. The conductive plastic according to claim 1, wherein, the conductive plastic further includes a redox agent; the redox agent is added in an amount of 1%-3% based on the total mass of the conductive plastic.

7. A wire cable shielding layer, the wire cable shielding layer comprises the conductive plastic according to claim 1.

* * * * *